United States Patent
Köhler et al.

(10) Patent No.: US 10,823,809 B2
(45) Date of Patent: Nov. 3, 2020

(54) DETERMINING A PHASE DIFFERENCE CAUSED BY EDDY CURRENTS FOR A MAGNETIC RESONANCE SYSTEM

(71) Applicant: Siemens Healthcare GmbH, Erlangen (DE)

(72) Inventors: Michael Köhler, Nuremberg (DE); Gudrun Ruyters, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/242,977

(22) Filed: Jan. 8, 2019

(65) Prior Publication Data
US 2019/0212407 A1    Jul. 11, 2019

(30) Foreign Application Priority Data

Jan. 9, 2018    (DE) .......................... 10 2018 200 239

(51) Int. Cl.
*G01V 3/00*      (2006.01)
*G01R 33/565*   (2006.01)
*G01R 33/48*    (2006.01)
*G01R 33/561*   (2006.01)

(52) U.S. Cl.
CPC ... *G01R 33/56518* (2013.01); *G01R 33/4818* (2013.01); *G01R 33/5616* (2013.01)

(58) Field of Classification Search
CPC .............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| | | | |
|---|---|---|---|
| 4,698,591 A | 10/1987 | Glover et al. | |
| 5,770,943 A | 6/1998 | Zhou | |
| 2004/0222791 A1* | 11/2004 | Chen ..................... | G01N 24/081 324/303 |
| 2005/0218894 A1* | 10/2005 | Miyawaki ........ | G01R 33/56518 324/309 |
| 2009/0253983 A1* | 10/2009 | Foo ........................ | A61B 5/055 600/420 |

(Continued)

OTHER PUBLICATIONS

German Office Action for German Application No. 10 2018 200 239.8 dated Apr. 3, 2020.

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A phase difference caused by eddy currents is determined for an MR system. First MR data is acquired with a first sequence by irradiating at least one RF pulse having an RF excitation pulse, importing a first test gradient during or after the RF excitation pulse, applying a read-out gradient, and acquiring the first MR data while the read-out gradient is switched, so the first MR data is acquired for at least one K-space line. Second MR data is acquired with a second sequence by importing a second test gradient during or after the RF excitation pulse, and applying the read-out gradient. The second MR data is acquired while the read-out gradient is switched, so the second MR data is acquired for the at least one K-space line. The phase difference per voxel is determined using the first MR data and the second MR data.

19 Claims, 5 Drawing Sheets

(56) References Cited

U.S. PATENT DOCUMENTS

| | | | |
|---|---|---|---|
| 2012/0098535 A1* | 4/2012 | Kaneta | G01R 33/56518 324/307 |
| 2013/0147481 A1* | 6/2013 | Miyawaki | G01R 33/56518 324/309 |
| 2015/0008921 A1* | 1/2015 | Lee | G01R 33/56518 324/309 |
| 2015/0115961 A1* | 4/2015 | Kannengiesser | G01R 33/483 324/309 |
| 2016/0118227 A1* | 4/2016 | Valcore, Jr. | H01J 37/32183 216/61 |

* cited by examiner

FIG 2
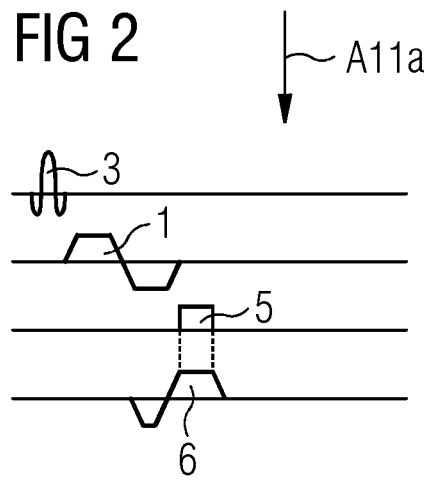
FIG 3
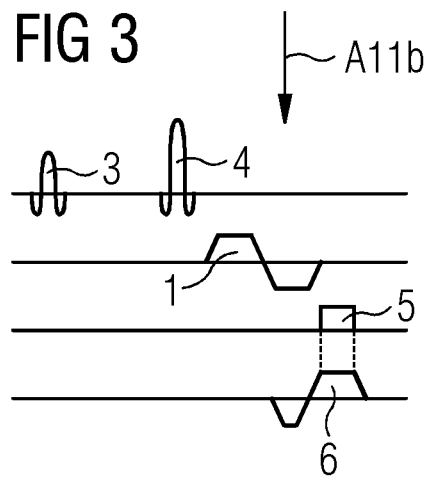
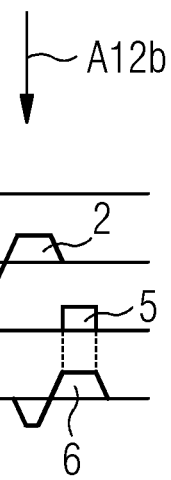
FIG 4
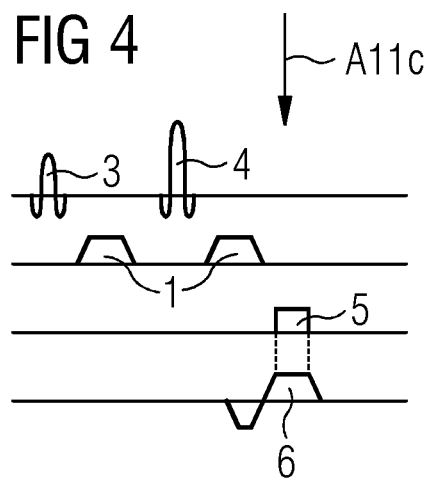
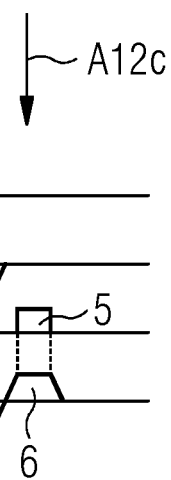

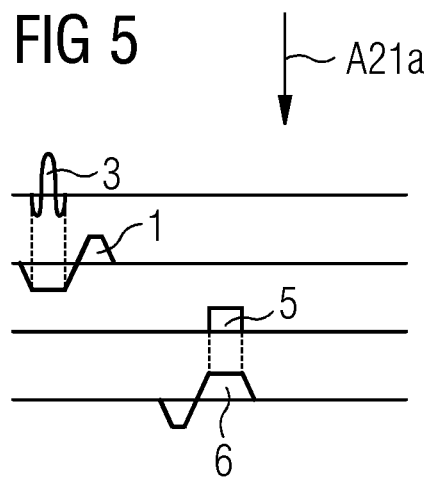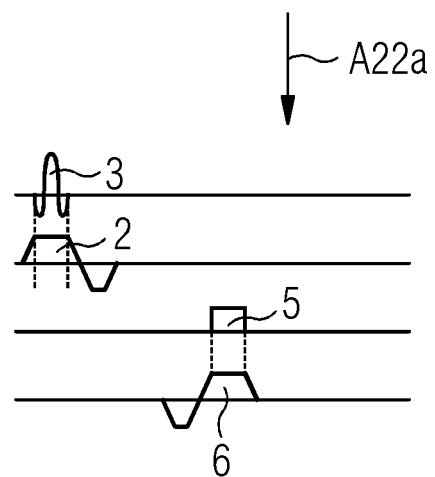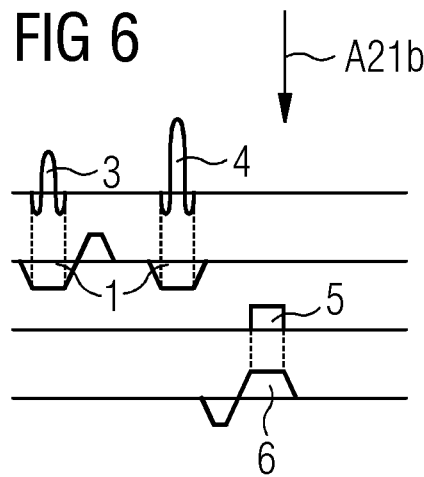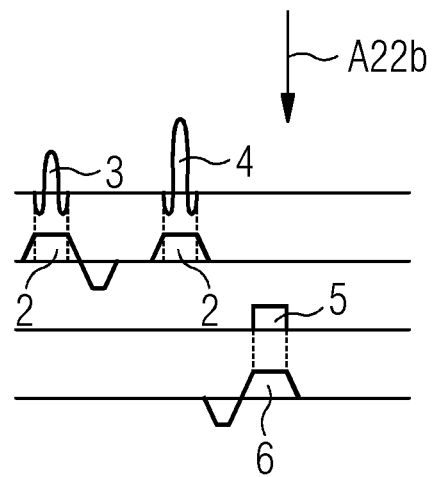

DETERMINING A PHASE DIFFERENCE CAUSED BY EDDY CURRENTS FOR A MAGNETIC RESONANCE SYSTEM

This application claims the benefit of German Patent Application No. 10 2018 200 239.8, filed Jan. 9, 2018, which is hereby incorporated herein by reference.

BACKGROUND

The present embodiments relate to determining a phase difference that is caused by eddy currents in a magnetic resonance system.

Eddy currents may be generated in magnetic resonance systems by changes in magnetic fields over time, and this is the case, for example, when switching gradient pulses. Due to a change in a magnetic field over time, each ramp of a gradient pulse may generate eddy currents according to Lenz's law in conductive structures that are found in a magnetic resonance system. Eddy currents cause time-dependent magnetic fields that, in principle, may have different geometries.

Time-dependent magnetic fields caused by eddy currents may have various disadvantageous effects in the case of scans using a magnetic resonance system. First, the phase of the MR signals is influenced by the eddy currents. Second, spatial distortions result owing to the gradient fields, modified by the eddy currents that are used for spatial encoding. One example, which is connected with influencing of the phase, is the occurrence of Nyquist ghosting with echo planar imaging (EPI) scans, and this is caused by the use of alternating read-out gradients. As a result, the K-space lines, which are scanned with positive amplitude of the read-out gradient, are influenced by field disruptions different from the K-space lines that are scanned with negative amplitude of the read-out gradients. For this effect, eddy currents that have already decayed again after a short time (e.g., decay time <1 ms) are particularly relevant. Eddy currents with comparatively long time constants may be compensated by the fast change in polarity of the read-out gradient (e.g., in the range of approximately 0.5-2 ms).

SUMMARY AND DESCRIPTION

The scope of the present invention is defined solely by the appended claims and is not affected to any degree by the statements within this summary.

The present embodiments may obviate one or more of the drawbacks or limitations in the related art. For example, a phase difference in a magnetic resonance system caused by eddy currents having short time constants (e.g., <10 ms) determined by an optimally short scan time is provided.

A method for determining a phase difference caused by eddy currents for a magnetic resonance system, a magnetic resonance system, a computer program product, and an electronically readable data carrier are provided.

Within the scope of the present embodiments, a method for determining a phase difference caused by eddy currents is provided for a magnetic resonance system. In the process, first magnetic resonance (MR) data is acquired with a first sequence, and second MR data is acquired with a second sequence. The first MR data is acquired by the first sequence by irradiating at least one radio-frequency (RF) pulse is irradiated. This at least one RF pulse includes an RF excitation pulse. Also, a first test gradient is imported. The first test gradient is active during or after the RF excitation pulse. In other words, the last ramp of the first test gradient is, for example, temporally not prior to the RF excitation pulse. Also, a read-out gradient is applied. The first MR data is acquired while this read-out gradient is switched, so the first MR data is acquired for at least one K-space line in one act.

The second MR data is acquired by the second sequence by irradiating the at least one RF pulse. Te at least one RF pulse corresponds exactly to the at least one RF pulse that is irradiated in the case of the first sequence. Also, a second test gradient is imported. The second test gradient is also active during or after the RF excitation pulse. Also, the read-out gradient is applied. This read-out gradient corresponds exactly to the read-out gradient that is applied in the case of the first sequence. The timing of the read-out gradient is also exactly the same in the case of the first sequency and the second sequence, respectively. The second MR data is acquired while the read-out gradient is switched, so the second MR data is acquired for the same at least one K-space line as in the case of the first sequence.

The first sequence therefore corresponds exactly to the second sequence, with the sole exception that an amplitude of the second test gradient corresponds to an inverted amplitude of the first test gradient. This provides that the amplitude $a_1(t)$ of the first test gradient at a particular instant with respect to the first sequence and the amplitude $a_2(t)$ of the second test gradient with respect to the second sequence satisfy the following equation (1).

$$a_1(t) = -a_2(t) \qquad (1)$$

The phase difference per voxel is determined as a function of the first MR data and the second MR data.

The first test gradient and the second test gradient have, for example, a duration of less than 15 ms.

For example, first image data is reconstructed as a function of the first MR data, and second image data is reconstructed as a function of the second MR data. One first image datum or complex value and one second image datum or complex value thereby exists per voxel. These two complex values differ per voxel essentially only by the phase. The phase difference may therefore be determined using the difference in the phase of the first image datum and the phase of the second image datum.

In a first variant, the test gradient (e.g., the first test gradient and the second test gradients) is in each case exported after the RF excitation pulse of the respective sequence. The test gradient is configured such that a total of the effective gradient moments is cancelled out before acquiring the MR data (e.g., the first MR data and the second MR data) or before the start of the acquisition window. The length and the amplitude of the test gradient and a corresponding interval until further events (e.g., gradient pulses, RF pulse, acquisition window) may be varied.

The first variant has three subvariants a, b and c.

In subvariant a, both the first sequence and the second sequence are gradient echo sequences. Between the RF excitation pulse and acquiring the MR data or the acquisition window, the test gradient is imported in the form of a positive gradient pulse and a negative gradient pulse having gradient moments that compensate each other.

In subvariant b, both the first sequency and the second sequence are spin echo sequences. Between the RF refocusing pulse and acquiring the MR data or the acquisition window, the test gradient is imported in the form of a positive gradient pulse and a negative gradient pulse having gradient moments that compensate each other. In one embodiment, the test gradient may be imported between the RF excitation pulse and the RF refocusing pulse.

In subvariant c, both the first sequence and the second sequence are again spin echo sequences. The test gradient includes two parts (e.g., a first part and a second part). The first part is imported between the RF excitation pulse and the RF refocusing pulse, while the second part is imported between the RF refocusing pulse and acquiring the MR data or the acquisition window. The first part and the second part have a same gradient moment. Refocusing between the two parts neutralizes dephasing effects, so an effective total of the gradient moments is equal to zero or disappears.

All subvariants of the first variant aim at largely compensating eddy currents with comparatively long time constants (e.g., long compared to the length or duration of the test gradient) up to the instant of the echo (e.g., acquiring the MR data). With a suitably short duration (e.g., <10 ms) of the test gradients, the effects of the eddy currents having the comparatively long time constants are therefore compensated. Eddy currents having very short time constants (e.g., compared to the period between the last ramp of the test gradient and the echo) will likewise be compensated up to the echo since there is an even number of ramps of the test gradient and the integrals of these eddy currents are neutralized up to the echo. A measurable effect is therefore only expected from eddy currents having relatively short time constants (e.g., approximately 0.1 ms to 10 ms). The selection of the general timing of the sequence (e.g., the first sequence and the second sequence) and the period between the last ramp of the respective test gradient and the echo may influence which eddy currents (e.g., with which time constants) lead to a measurable effect. The exponential drop in these eddy currents with respect to the last ramp of the test gradient will then lead to a measurable effect beyond the echo, so the integrals of the eddy currents of all ramps are no longer compensated.

The first variant assumes that the time constant of the eddy current effect to be acquired is temporally long enough as a function of the signal-to-noise ratio, that these eddy current effects have not yet decayed up to the echo time. In other words, the sequence (e.g., the first sequence and the second sequence) is to be configured such that the eddy current effects to be acquired have not yet decayed up to the echo time.

In the second variant, the test gradient is exported during the RF excitation pulse and/or during an RF refocusing pulse of the at least one RF pulse. With selective RF pulses (e.g., with RF pulses that have a limited frequency spectrum), the test gradient acts like a slice selection gradient.

The second variant has two subvariants a and b.

In subvariant a, both the first sequence and the second sequence are gradient echo sequences. The test gradient also includes the necessary rephasing gradient. In the case of the second sequence, both the slice selection gradient part and the rephasing gradient part of the test gradient are therefore inverted compared to the test gradient of the first sequence.

In subvariant b, both the first sequence and the second sequence are spin echo sequences. The following possibilities exist for this subvariant b of the second variant: The respective test gradient is only imported during the RF excitation pulse (and not during the RF refocusing pulse). This applies to the first sequence and the second sequence. The respective test gradient is only imported during the RF refocusing pulse (and not during the RF excitation pulse). This applies to the first sequence and the second sequence. The respective test gradient is imported during the RF excitation pulse as well as during the RF refocusing pulse. The part of the test gradient imported during the RF excitation pulse may have a polarity different from the part of the test gradient that is imported during the RF refocusing pulse. This applies to the first sequence and the second sequence.

The RF excitation pulse and/or the RF refocusing pulse may be selective or non-selective. When the RF excitation pulse and/or the RF refocusing pulse is/are selective, the test gradient acts as a slice selection gradient.

The subvariants and various possibilities of these subvariants with respect to the second variant aim at measuring the effects of eddy currents having extremely short time constants (e.g., <0.1 ms). By contrast, the effects of eddy currents having relatively long time constants are largely compensated in the second variant. If the test gradient is active during the RF excitation pulse, then, use is made of the fact that, during the first ramp of the test gradient, which is before the RF excitation pulse timewise, there is still no transversal magnetization that leads to the generation of the echo. The field error that exists during this first ramp and that is caused by eddy currents does not influence the acquired MR data (e.g., the first MR data and the second MR data) thereby and does not influence the measured phase, therefore. Since only the first ramp of the test gradient is before the RF excitation pulse timewise, all further ramps of the test gradient are after the RF excitation pulse timewise, so an odd number of ramps of the test gradient exists following generation of the transversal magnetization.

If the test gradient is active during the RF refocusing pulse, then the effects are not compensated during the ascending and descending ramp of the test gradient but add up instead.

As a further possibility, the test gradient may begin before the RF excitation pulse timewise, so the test gradient attains a corresponding plateau before the beginning of the RF excitation pulse. This provides that the eddy current generated by the first ramp of the test gradient has largely dropped if the transversal magnetization is generated.

As has already been described above for example, the ramp of a gradient pulse and, accordingly, of the respective test gradient, generates an eddy current. Frequently, for the sake of simplicity, an exponential decay of the magnetic field generated thereby is assumed, as may be inferred from the following relationship (2).

$$B\_EC(t) \sim e^{-t/\tau} \tag{2}$$

B_EC(t) designates the magnetic field generated by the eddy current, t designates the time, and τ designates the time constant of the eddy current. In addition, the field errors generated by gradient pulses may have oscillatory components, on which, however, the exponential drop illustrated above in relationship (2) is also superimposed. These oscillations may be generated, for example, by mechanical vibrations. Measurement of these field errors is likewise a component of the subject described here.

The magnetic fields described above, which are caused by eddy currents, lead to the transversal magnetization accumulating a phase φ over a period t, and this may be expressed by the following equation (3), where γ corresponds to the gyromagnetic ratio.

$$\varphi(t) = 2\pi\gamma \int_0^t B\_EC(t')dt' \tag{3}$$

In one embodiment, at least the subvariants a and b of the first variant may scan the same K-space points several times by varying an echo time when acquiring the first MR data and the second MR data, respectively. Due to this variation in the time parameter (e.g., a variation in the period between the respective test gradient and the acquisition window), it may be determined per voxel how the eddy current effect decays as a function of the time parameter or as a function of the time at which the respective MR data is acquired after the test gradient. By scanning the K-space points several times, a plurality of first image data and second image data may be reconstructed per voxel as a function of the first MR data or the second MR data, respectively. Using this first image data and second image data, the function described in equation (G1), which also has the exponential course described in relationship (2), may then be adjusted (e.g., for T>>τ).

$$\varphi(t) = 2\pi\gamma A \tau e^{-(t-2T+T_{Ramp})/\tau} \quad (G1)$$

φ(t) corresponds to the phase difference dependent on the time parameter t, γ corresponds to the gyromagnetic ratio, r is a time constant of the eddy current, T the total of plateau time and duration of one of the two gradient ramps (assumed to be the same for simplification) of the first test gradient or the second test gradient, respectively, and $T_{Ramp}$ corresponds to the duration of a gradient ramp of the first test gradient or the second test gradient, respectively. The constant A, which indicates the magnitude of the eddy current at the end of the ramp, and the time constant τ may be determined by way of the fit of the phase differences, determined with the aid of the first image data and the second image data, as a function of the time parameter t to the described function. The time parameter t corresponds to a time from the end of the first ramp of the first test gradient or the second test gradient to the echo instant.

In one embodiment, a function corresponding to equation (G1) may be indicated for each voxel by determining the constant A and the time constant τ for each voxel. In one embodiment, a function corresponding to equation (G1) may, however, be virtually determined regardless of location (e.g., once for the entire volume portion that corresponds to the K-space) by determining the constant A and the time constant τ once. Consequently, this function represents a mean of the functions determined per voxel.

A further possibility at least for the subvariants a and b of the first variant is to scan the same K-space points several times by varying an echo time when acquiring the first MR data and the second MR data, respectively. By this variation of the time parameter (e.g., a variation in the period between the respective test gradient and the acquisition window), it is possible to determine per voxel how the eddy current effect decays as a function of the time parameter or as a function of the time at which the respective MR data is acquired after the test gradient. By sampling the K-space points several times, a plurality of first image data and second image data may be reconstructed per voxel as a function of the first MR data or second MR data, respectively. The spatial distributions of the eddy current effects measured using the first image data and the second image data may be segmented into suitable basic functions. The function set forth in equation (G2) is used, for example, for this purpose.

$$\varphi(x,y,z,t) = 2\pi\gamma \Sigma_i B_i(t) X_i(x,y,z) \quad (G2)$$

φ(x,y,z,t) corresponds to the phase shift dependent on the location x, y, z and on the time or the time parameter t. The phase shift is caused by the eddy current effects. $X_i(x, y, z)$ corresponds to a spatial basic function, where $B_i(t)$ corresponds to an amplitude of this basic function, which is effective for a measurement with time t and satisfies the following equation (G3).

$$B_i(t) = A_i \tau_i e^{-(t-2T+T_{Ramp})/\tau_i} \quad (G3)$$

The constants T and $T_{Ramp}$ are known from the description relating to equation (G1). The parameter $A_i$ designates the amplitude of the corresponding basic function at the end of a gradient ramp, and $\tau_i$ designates the time constant of the corresponding basic function $B_i(t)$. The amplitudes $B_i(t)$ of the spatial basic functions determined by the measurements (e.g., of the first image data and the second image data) with various times t may be plotted against the time t. The parameters $A_i$ and $\tau_i$ for each spatial basic function $X_i(x,y,z)$ may then be determined by an adjustment or fit of the function described in equation (G3) to the values $B_i(t)$ determined for the various times t.

This embodiment has the advantage that mutually independent amplitudes and time constants may be determined for different spatial field distributions.

Within the scope of the present embodiments, a magnetic resonance system that includes an RF control unit (e.g., an RF controller), a gradient control unit (e.g., a gradient controller), and an image sequence controller (e.g., an image sequence controller) is provided. The RF control unit, the gradient control unit, and the image sequence controller are configured to acquire first MR data with a first sequence by the magnetic resonance system: irradiating, using the RF control unit, at least one RF pulse that includes an RF excitation pulse; importing, by the gradient control unit, a first test gradient during or after the RF excitation pulse and applying a read-out gradient; and acquiring the first MR data while the read-out gradient is switched, so the first MR data is acquired for at least one K-space line. To acquire second MR data with a second sequence, the magnetic resonance system is configured to irradiate the at least one RF pulse using the RF control unit in order to import a second test gradient using the gradient control unit during or after the RF excitation pulse, and to apply the read-out gradient. The second MR data is acquired by the magnetic resonance system while the read-out gradient is switched, so the second MR data is acquired for the at least one K-space line. In one embodiment, the first sequence corresponds to the second sequence with the sole exception that the amplitude of the second test gradient corresponds to an inverted amplitude of the first test gradient. The magnetic resonance system is also configured to determine the phase difference per voxel using the first MR data and the second MR data.

The advantages of the magnetic resonance system essentially match the advantages of the method, which have been described above in detail, so a repetition is omitted here.

The present embodiments also includes a computer program product (e.g., a computer program or software) that may be loaded into a storage device of a programmable controller or an arithmetic unit of a magnetic resonance system. All embodiments or different embodiments of the method described above may be implemented with this computer program product when the computer program product runs in the controller or control device of the magnetic resonance system. The computer program product may include program means (e.g., libraries and auxiliary functions) to implement the corresponding embodiments of the methods. In other words, the computer program product may, for example, cover a computer program or software with which one of the above-described embodiments of the method may be implemented or which implements this embodiment. The software may be a source code (e.g., C++) that is still to be compiled (e.g., converted) and linked or is only to be interpreted, or an executable software code that is only to be loaded into the corresponding arithmetic unit or control device for execution.

The present embodiments relate to an electronically readable data carrier (e.g., a non-transitory computer-readable storage medium such as a DVD, a magnetic tape, a hard disk or a USB stick), on which electronically readable control information (e.g., software including instructions) is stored. When this control information (e.g., software) is read from the data carrier and stored in a control device or arithmetic unit of a magnetic resonance system, all embodiments of the method described above may be carried out.

By acquiring at least MR data of one K-space line per sequence, the measuring time is advantageously shorter than with methods that, for example, acquire only MR data for one or only a few K-space points per sequence. The present embodiments may also be integrated very easily in existing MR sequences and require less effort with respect to reconstruction of the image data.

With the method, for example, directly spatially resolved phase images that are influenced by eddy currents, vibrations, or other gradient imperfections are generated. Interpretation of the determined image data is easy since the generated spatially resolved images contain the relevant information directly.

With the present embodiments, it is possible to investigate image quality problems and to potentially attribute the image quality problems to eddy currents (e.g., to eddy currents having a short time constant). The acquired phase differences (e.g., per voxel) may be used to identify the cause of these eddy currents, so measures may be taken to remove these causes. Specific knowledge about the spatial distribution of the eddy current effects and corresponding time constants may help to gauge effects on the image quality and identify the technical causes of the eddy current effects. The image quality of the inventive magnetic resonance system may be improved thereby. The easy-to-implement method provides that it may be determined as early as in the development phase of components for magnetic resonance systems whether short-term eddy currents that will potentially lead to image artifacts in particular applications occur.

With the present embodiments, at least the results following from the first variant may be used in order to thereby compensate eddy currents.

BRIEF DESCRIPTION OF THE DRAWINGS

FIG. 2 illustrates sequences according to a first subvariant of a first variant.

FIG. 3 illustrates sequences according to a second subvariant of the first variant.

FIG. 4 illustrates sequences according to a third subvariant of the first variant.

FIG. 5 illustrates sequences according to the first subvariant of a second variant.

FIG. 6 illustrates sequences according to the second subvariant of the second variant.

DETAILED DESCRIPTION

Figure 1:
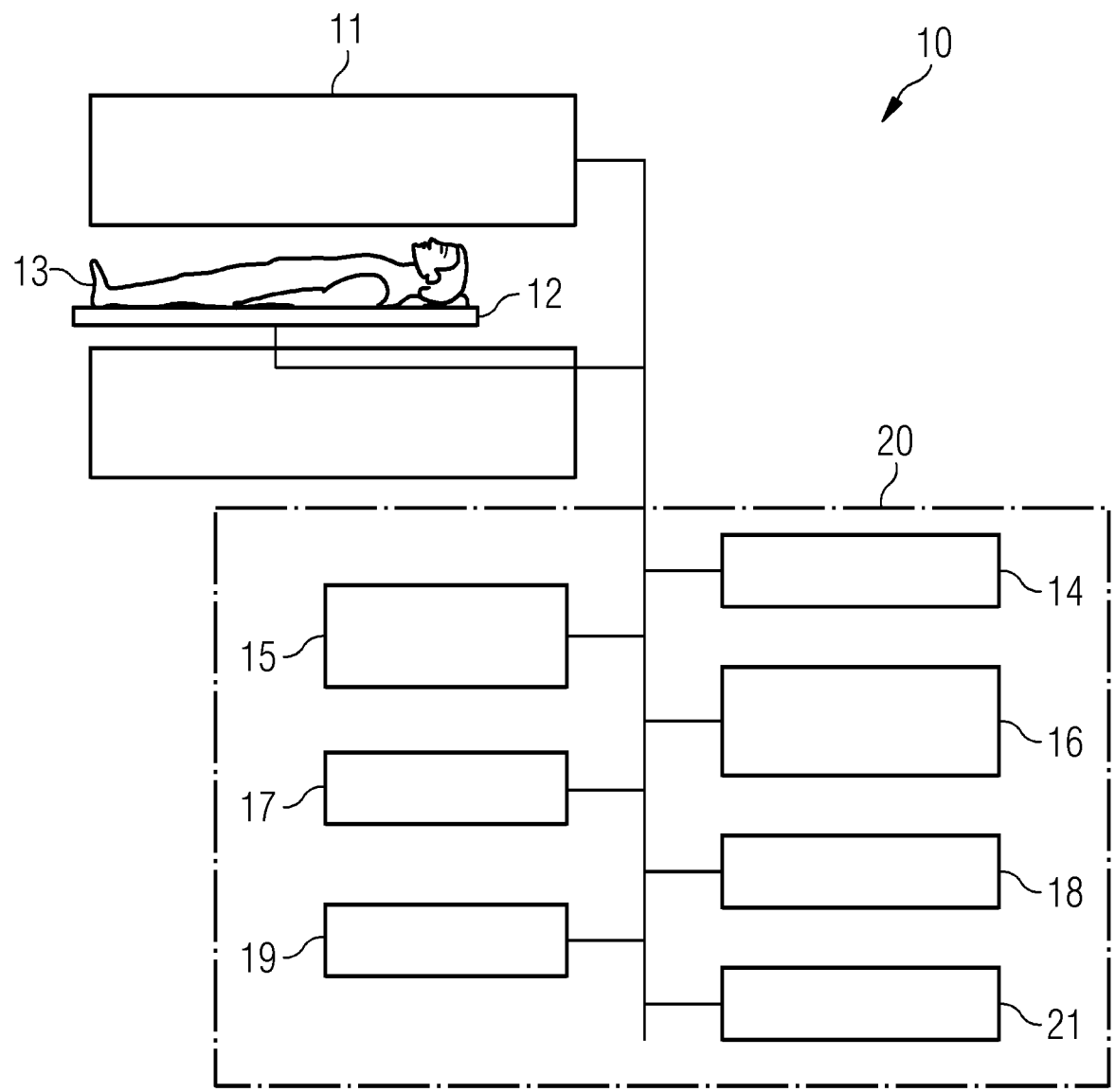
FIG. 1 schematically shows one embodiment of a magnetic resonance system.

With reference to FIG. 1, a magnetic resonance system 10, with which, as will be explained below, one phase difference per voxel, caused by eddy current effects, may be determined, is illustrated. The magnetic resonance system 10 has a magnet 11 for generating a polarization field B0, where an examination person 13 arranged on a couch 12 is moved into the magnet 11 to acquire spatially encoded magnetic resonance signals or MR data there from the examination person 13. The coils used for signal acquisition, such as a body coil or local coils, are not shown for the sake of clarity. By irradiating radio frequency pulses and switching magnetic field gradients, the magnetization generated by the polarization field B0 may be moved from the position of equilibrium and spatially encoded, and the resulting magnetization is detected by the receiver coils. How MR images may be generated by irradiating the RF pulses and by switching magnetic field gradients in different combinations and sequences is basically known to a person skilled in the art and will not therefore be illustrated in more detail here.

The magnetic resonance system 10 also has a control unit 20 that may be used for controlling the magnetic resonance system 10. The controller 20 has a gradient control unit 15 for controlling and switching the required magnetic field gradients. An RF control unit 14 is provided for the control and generation of the RF pulses in order to deflect the magnetization. An image sequence controller 16 controls the sequence of the magnetic field gradients and RF pulses and thereby, indirectly, the gradient control unit 15 and the RF control unit 14. By way of an input unit 17, an operator may control the magnetic resonance system 10, and MR images and other information required for control may be displayed on a display unit 18. An arithmetic unit 19 having at least one processor unit (not shown) is provided for controlling the different units in the control unit 20. A storage unit 21, in which, for example, program modules or programs that, when run by the arithmetic unit 19 or a corresponding processor unit, may control the course of action of the magnetic resonance system 10 may be stored, is provided. The arithmetic unit 19 is configured to calculate the MR images from the acquired MR signals.

According to one or more of the present embodiments, two methods or variants are provided in order to be able to measure the effects of eddy currents having short time constants (e.g., <10 ms or <1 ms). Each of these variants may then be implemented by different subvariants. The MR sequence used is exported twice, where in the second acquisition, the amplitude of the test gradient is inverted relative to the first acquisition. The measured variable is the phase difference between these two acquisitions, respectively. FIGS. 2 to 6 illustrate the two variants with corresponding subvariants. In each case, a read-out gradient 6 is switched during the acquisition window 5, so an entire line in the K-space is measured during each acquisition. The measured phase difference then reflects the field error integrated up to the instant of the echo, with it being assumed that precisely this field error is caused particularly by eddy currents, but also by vibrations or other imperfections of the test gradient 1, 2.

The first variant is illustrated with corresponding subvariants a to c in FIGS. 2 to 4. In this first variant, a test gradient 1, 2 is added to a sequence after the RF excitation pulse 3. Both the first test gradient 1 of acquisitions A11a, A11b, A11c and the second test gradient 2 of acquisitions A12a, A12b, A12c are structured such that the total of the effective gradient moments, which are caused by the respective test gradient 1, 2, are cancelled out before the start of the acquisition window 5 in the case of each sequence. In the illustrated case, the area of the positive gradient pulse of the respective test gradient 1, 2 is equal to the area of the negative gradient pulse. The length and the amplitude of the gradient pulses of the respective test gradient 1, 2, and the time interval between the respective test gradient to further events (e.g., further gradient pulses, RF pulses, acquisition window) may be varied. The second test gradient of the second acquisition A12a, A12b, A12c corresponds in each case to the inverted first test gradient of the first acquisition A11a, A11b, A11c.

FIG. 2 illustrates, respectively (e.g., for the first acquisition A11a and for the second acquisition A12a), a gradient echo sequence as subvariant a of the first variant. The test gradient 1, 2 is in each case between the RF excitation pulse and the acquisition window 5.

FIG. 3 illustrates, respectively, (e.g., for the first acquisition A11b and for the second acquisition A12b) a spin echo sequence as subvariant b of the first variant. The test gradient 1, 2 is, in each case, between the RF refocusing pulse 4 and the acquisition window 5. The respective test gradient 1, 2 may also be imported between the RF excitation pulse 3 and the RF refocusing pulse 4.

FIG. 4 illustrates, respectively (e.g., for the first acquisition A11c and for the second acquisition A12c), a spin echo sequence as subvariant c of the first variant. A first part or gradient pulse of the respective test gradient 1, 2 is imported between the RF excitation pulse 3 and the RF refocusing pulse 4, and a second part or gradient pulse of the respective test gradient 1, 2 is imported between the RF refocusing pulse and the acquisition window 5. The first part and the second part of the respective test gradient 1, 2 have the same gradient moment. Due to refocusing, which occurs between the two parts or gradient pulses of the same test gradient 1, 2, the dephasing effects of the two parts or gradient pulses are neutralized, so the effective total of the gradient moments, which are caused by the respective test gradient 1, 2, disappears or is zero.

In order to calculate the measurable effect, it is sufficient to consider the exponential drops in the eddy currents generated by the individual ramps that are present after the individual ramps of the respective test gradient 1, 2. The increases in the eddy currents during the individual ramps are compensated, so the same number of ascending and descending ramps exists for the respective test gradient 1, 2. If the subvariants a and b of the first variant are considered, then the phase, accumulated at instant t of the echo, of the field errors generated by the eddy currents is produced by the following equation (4):

$$\varphi(t) = 2\pi\gamma A \int_0^t e^{-\frac{t'}{\tau}} dt' - $$
$$2\pi\gamma A \int_T^t e^{-\frac{(t'-T)}{\delta}} dt' - 2\pi\gamma A \int_{T+T_{Ramp}}^t e^{-\frac{(t'-T-T_{Ramp})}{\tau}} dt' + $$
$$2\pi\gamma A \int_{2T+T_{Ramp}}^t e^{-\frac{(t'-2T-T_{Ramp})}{\tau}} dt' = $$
$$2\pi\gamma A\tau \left( e^{-t/\tau} - e^{-(t-\tau)/\tau} - e^{-(t-\tau-T_{Ramp})/\tau} + e^{-(t-2T+T_{Ramp})/\tau} \right)$$

Figure 7:
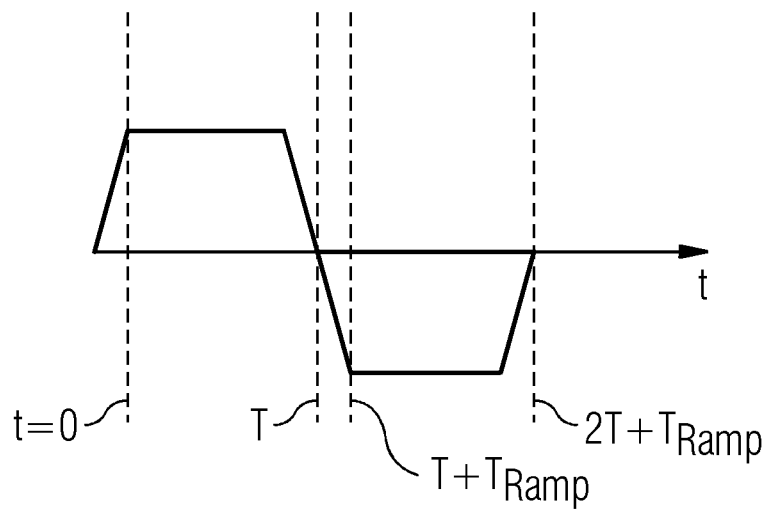
FIG. 7 illustrates an exemplary test gradient.

(4)

γ is the gyromagnetic ratio, A is the magnetic field generated by an eddy current after the end of the gradient ramp, τ is the time constant of the eddy current, T is the total of plateau time and duration of a gradient ramp, and $T_{Ramp}$ is the duration of a gradient ramp (e.g., all gradient ramps are assumed to be equal for simplicity). The instant t is after the respective test gradient 1, 2 timewise, so $t>2T+T_{Ramp}$ applies. See also FIG. 7 in this regard.

Eddy currents with comparatively long time constants (e.g., τ>>T, τ>>$T_{Ramp}$) are compensated at instant t. Therefore, with suitable selection of the duration of the test gradient 1, 2, (e.g., short; T<10 ms and $T_{Ramp}$<1 ms), the measured variable (e.g., the phase difference) is dominated by eddy currents with short time constants. The equation (G1) already described above is therefore produced for eddy currents with short time constants (τ<<T).

$$\varphi(t)=2\pi\gamma A\tau e^{-(t-2T+T_{Ramp})/\tau}$$ (G1)

FIGS. 5 and 6 illustrate the two subvariants a and b of the second variant. In the second variant, a test gradient 1, 2 is irradiated during an RF pulse of an MR sequence. As in the first variant, the second variant is also inverted with respect to the test gradient 1 of the first acquisition during the second acquisition of this test gradient 2. With selective RF pulses (e.g., RF pulses that have a limited frequency spectrum), the respective test gradient then acts as a slice selection gradient.

FIG. 5 illustrates, respectively (e.g., for the first acquisition A21a and for the second acquisition A22a), a gradient echo sequence as a subvariant a of the second variant. During the RF excitation pulse 3, the respective test gradient 1, 2 acts as a slice selection gradient. The test gradient 1, 2 therefore also has the necessary rephasing gradient. The second test gradient 2 of the second acquisition A22a, including a corresponding rephasing gradient, corresponds to the inverted first test gradient 1 of the first acquisition A21a. Reference is made to the fact that the RF excitation pulse does not have to be selective, with the respective test gradient 1, 2 not playing the part of a slice selection gradient in this case.

FIG. 6 illustrates, respectively (e.g., for the first acquisition A21b and for the second acquisition A22b), a spin echo sequence as a subvariant b of the second variant. In the illustrated case, the respective test gradient 1, 2 is imported during the RF excitation pulse 3 as well as during the RF refocusing pulse 4. More precisely, a first part of the respective test gradient 1, 2 is imported during the RF excitation pulse 3, and a second part of the respective test gradient 1, 2 is imported during the RF refocusing pulse 4. In one embodiment, the respective test gradient 1, 2 is only imported during the RF excitation pulse 3 or only during the RF refocusing pulse 4. The first part of the respective test gradient 1, 2 may have a different polarity than the second part of the respective test gradient 1, 2. Further, only the RF excitation pulse 3, only the RF refocusing pulse 4, or both the RF excitation pulse 3 and the RF refocusing pulse 4 may be selective, so the respective test gradient 1, 2 acts as a slice selection gradient.

Figure 8:
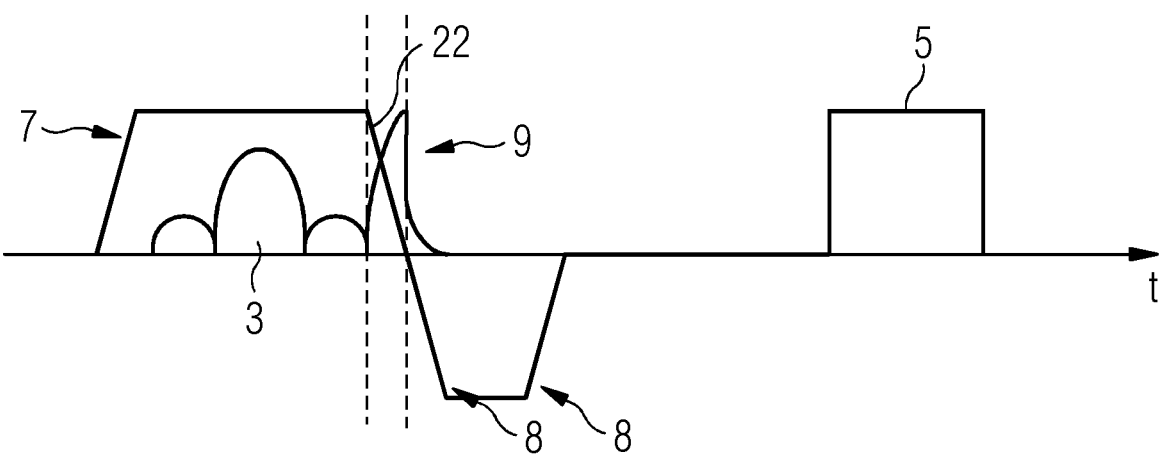
FIG. 8 illustrates an example of the second variant.

With the second variant illustrated in FIGS. 5 and 6, essentially the time integral of the field errors generated by eddy currents or vibrations or other gradient imperfections is measured, as is illustrated in FIG. 8. Information about this integral may be helpful in order, for example, to investigate the spatial distribution of eddy currents having very short time constants (e.g., <0.1 ms). The effects on certain artifacts (e.g., Nyquist ghosting) may be assessed thereby. Components that, due to presence in the magnetic resonance system, cause eddy currents having very short time constants may be identified. It may consequently be assessed whether the presence of these components is expressed in the generation of artifacts in the case of other MR scans.

The subvariant a of the second variant illustrated in FIG. 5 will be explained in more detail with the aid of FIG. 8. Eddy currents having very short time constants, which are caused by the first ramp 7 of the test gradient 1, 2, may not be measured using the MR data acquired after the test gradient since, at the instant of this first ramp 7, the RF excitation pulse 3 has not yet been irradiated, so there is still no transversal magnetization. The integrals, which add up the effects of the eddy currents having very short time constants in respect of the two ramps 8 of the second part or rephasing gradient pulse, respectively, of the respective test gradient 1, 2, are compensated exactly. Therefore, only the integral 9 is measured, which adds up the eddy current effects caused by the gradient ramp 22.

Figure 9:
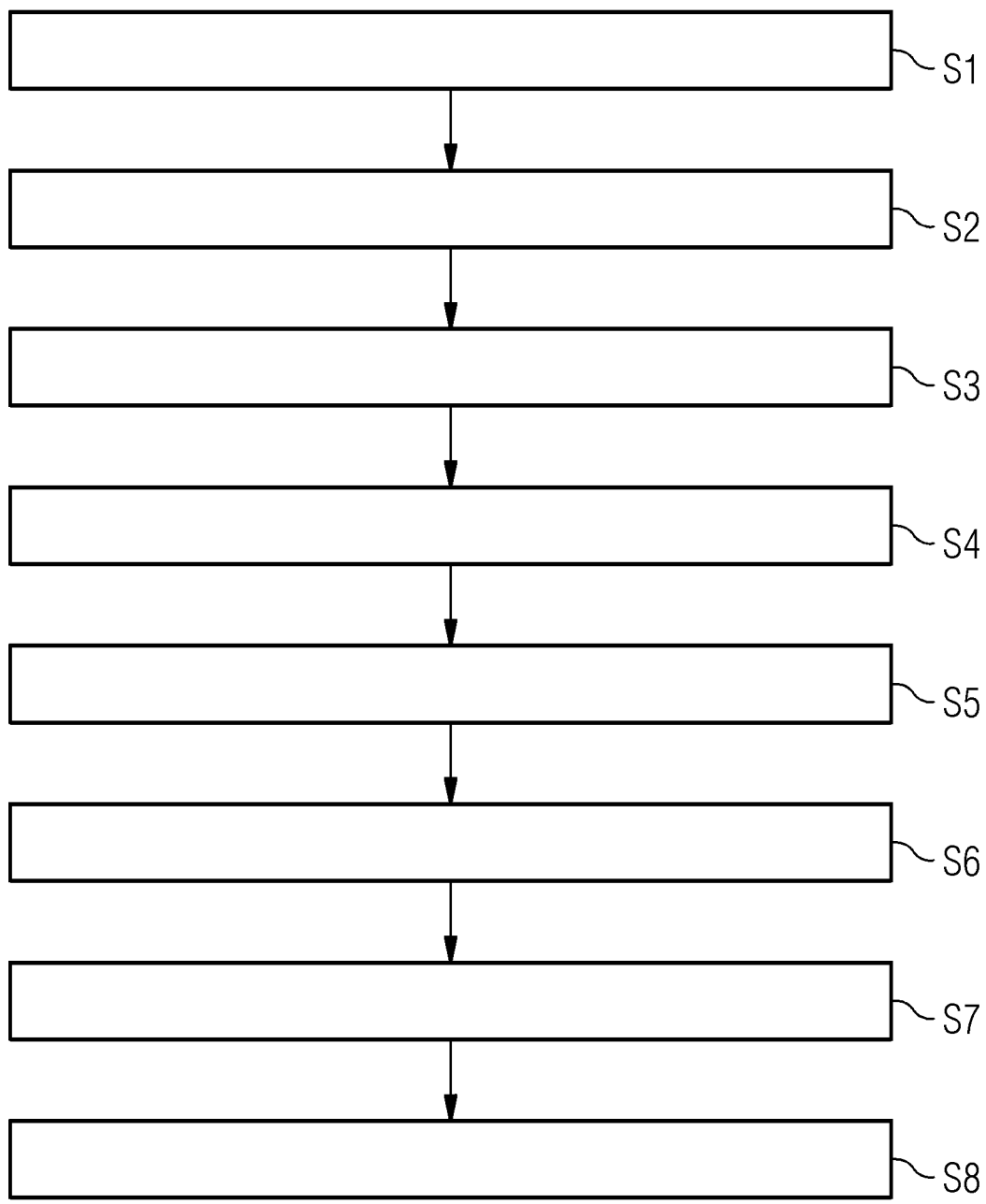
FIG. 9 represents the flowchart of one embodiment of a method.

FIG. 9 illustrates the flowchart of an embodiment of a method.

An RF excitation pulse 3 is irradiated in act S1 while a first test gradient 1 is imported in act S2. In the following act S3, first MR data is acquired by reading out a K-space line with the aid of a read-out gradient 6. Similarly, the same RF excitation pulse 3 as in act S1 is irradiated in act S4, and in act S5, a second test gradient 2 is imported. This second test gradient 2 has an inverted amplitude compared to the first test gradient 1. In act S6, second MR data is acquired by reading out the same K-space line by the same read-out gradient 6 as in act S3.

Acts S1-S6 are, for example, repeated until the entire K-space has been acquired virtually twice (e.g., once with the first sequence, which includes the first test gradient 1, and once with the second sequence, which differs from the first sequence only with respect to the test gradient 2). In act S7, first image data and second image data are reconstructed using the first MR data and the second MR data. More precisely, the first image data is reconstructed using the first MR data, and the second image data is reconstructed using the second MR data in act S7. This image data differs essentially per voxel only with reference to the phase. Therefore, the phase difference is determined per voxel in act S8 as a function of the first image data and the second image data. This phase difference reflects the eddy current effects for the respective voxel.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a phase difference caused by eddy currents for a magnetic resonance system, the method comprising:
    acquiring first magnetic resonance (MR) data with a first sequence, the acquiring of the first MR data comprising:
        irradiating at least one radio frequency (RF) pulse, the at least one RF pulse comprising an RF excitation pulse;
        importing a first test gradient during or after the RF excitation pulse;
        applying a read-out gradient; and
        acquiring the first MR data while the read-out gradient is switched, so the first MR data is acquired for at least one K-space line;
    acquiring second MR data with a second sequence, the acquiring of the second MR data comprising:
        irradiating the at least one RF pulse;
        importing a second test gradient during or after the RF excitation pulse;
        applying the read-out gradient; and
        acquiring the second MR data while the read-out gradient is switched, so the second MR data is acquired for the at least one K-space line, wherein the first sequence corresponds to the second sequence with a sole exception that an amplitude of the second test gradient corresponds to an inverted amplitude of the first test gradient; and
    determining the phase difference per voxel using the first MR data and the second MR data,
    wherein each test gradient of the first test gradient and the second test gradient temporally overlap the at least one RF pulse.

2. A magnetic resonance system comprising:
    a radio frequency (RF) control unit, a gradient control unit, and an image sequence controller that are configured to acquire magnetic resonance (MR) data of a volume portion of an examination object,
    wherein the magnetic resonance system is configured to acquire first MR data with a first sequence, the acquisition of the first MR data comprising:
        irradiation, by the magnetic resonance system using the RF control unit, at least one RF pulse, the at least one RF pulse comprising an RF excitation pulse;
        importation of a first test gradient by the gradient control unit during or after the RF excitation pulse;
        application of a read-out gradient; and
        acquisition of the first MR data while the read-out gradient is switched, so the first MR data is acquired for at least one K-space line,
    wherein the magnetic resonance system is further configured to acquire second MR data with a second sequence, the acquisition of the second MR data comprising:
        irradiation, by the magnetic resonance system using the RF control unit, of the at least one RF pulse;
        importation of a second test gradient by the gradient control unit during or after the RF excitation pulse;
        application of the read-out gradient; and
        acquisition of the second MR data while the read-out gradient is switched, so the second MR data is acquired for the at least one K-space line,
    wherein the first sequence corresponds to the second sequence with a sole exception that an amplitude of the second test gradient corresponds to an inverted amplitude of the first test gradient,
    wherein each test gradient of the first test gradient and the second test gradient temporally overlap the at least one RF pulse, and
    wherein the magnetic resonance system is further configured to determine the phase difference per voxel using the first MR data and the second MR data.

3. In a non-transitory computer-readable storage medium that stores instructions executable by a controller of a magnetic resonance system to determining a phase difference caused by eddy currents for a magnetic resonance system, the instructions comprising:
    acquiring first magnetic resonance (MR) data with a first sequence, the acquiring of the first MR data comprising:

irradiating at least one radio frequency (RF) pulse, the at least one RF pulse comprising an RF excitation pulse;

importing a first test gradient during or after the RF excitation pulse;

applying a read-out gradient; and acquiring the first MR data while the read-out gradient is switched, so the first MR data is acquired for at least one K-space line;

acquiring second MR data with a second sequence, the acquiring of the second MR data comprising:

irradiating the at least one RF pulse;

importing a second test gradient during or after the RF excitation pulse;

applying the read-out gradient; and acquiring the second MR data while the read-out gradient is switched, so the second MR data is acquired for the at least one K-space line, wherein the first sequence corresponds to the second sequence with a sole exception that an amplitude of the second test gradient corresponds to an inverted amplitude of the first test gradient; and determining the phase difference per voxel using the first MR data and the second MR data, wherein each test gradient of the first test gradient and the second test gradient temporally overlap the at least one RF pulse.

4. The method of claim 1, wherein the first test gradient and the second test gradient are each imported after the RF excitation pulse.

5. The method of claim 4, wherein each sequence of the first sequence and the second sequence is a gradient echo sequence, wherein each test gradient of the first test gradient and the second test gradient comprises a positive gradient pulse and a negative gradient pulse, and wherein a gradient moment of the positive gradient pulse compensates a gradient moment of the negative gradient pulse.

6. The method of claim 4, wherein each sequence of the first sequence and the second sequence is a spin-echo sequence, and wherein the at least one RF pulse further comprises an RF refocusing pulse.

7. The method of claim 6, wherein each test gradient of the first test gradient and the second test gradient is imported after the refocusing pulse and before acquiring the first data or the second data, respectively, wherein each test gradient of the first test gradient and the second test gradient comprises a positive gradient pulse and a negative gradient pulse, and wherein a gradient moment of the positive gradient pulse compensates a gradient moment of the negative gradient pulse.

8. The method of claim 1, further comprising:

reconstructing first image data from the first MR data;

reconstructing second image data from the second MR data; and determining the phase difference per voxel using the first image data and the second image data.

9. The method of claim 5, further comprising:

reconstructing first image data from the first MR data;

reconstructing second image data from the second MR data;

determining the phase difference per voxel using the first image data and the second image data;

scanning same K-space points a plurality of times, the scanning comprising varying an echo time when acquiring the first MR data and the second MR data, respectively, wherein a function that satisfies the equation $\varphi(t)=2\pi\gamma A\tau e^{-(t-2T+T_{Ramp})/\tau}$ describes a phase difference $\varphi$; and adjusting the function as a function of the reconstructed first image data and the reconstructed second image data, such that constants A and $\tau$ are determined, wherein t is a time between an end of a first ramp of the first test gradient or the second test gradient and an instant of an echo, wherein $\gamma$ is a gyromagnetic ratio, wherein $\tau$ is a time constant of an eddy current, wherein T is a total of plateau time and duration of a gradient ramp of the first test gradient or the second test gradient, respectively, and wherein $T_{ramp}$ is a duration of the gradient ramp of the first test gradient or the second test gradient.

10. The method of claim 5, further comprising:

reconstructing first image data from the first MR data;

reconstructing second image data from the second MR data;

determining the phase difference per voxel using the first image data and the second image data;

scanning same K-space points a plurality of times, the scanning comprising varying an echo time when acquiring the first MR data and the second MR data, respectively, wherein a function that satisfies the equation $\varphi(x,y,z,t)=2\pi\gamma\Sigma_i B_i(t)X_i(x,y,z)$ describes a phase difference $\varphi$ as a function of location x,y,z, wherein $X_i(x,y,z)$ corresponds to a spatial basic function, wherein $B_i(t)$ corresponds to an amplitude of the spatial basic function, wherein $B_i(t)$ satisfies the equation $B_i(t)=A_i\tau_i e^{-(t-2T+T_{Ramp})/\tau_i}$; and adjusting the function as a function of the reconstructed first image data and the reconstructed second image data, such that the constants $A_i$ and $\tau_i$ are determined, wherein t is a time between an end of a first ramp of the first test gradient or the second test gradient and an instant of an echo, wherein $\gamma$ is a gyromagnetic ratio, wherein $\tau_i$ is a time constant of an eddy current, respectively, wherein T is a total of plateau time and duration of the first ramp of the first test gradient or second test gradient, respectively, and wherein $T_{ramp}$ is a duration of a gradient ramp of the first test gradient or the second test gradient.

11. The method of claim 7, wherein a first part of each test gradient of the first test gradient and the second test gradient is imported between the RF excitation pulse and the refocusing pulse, wherein a remaining second part of each test gradient of the first test gradient and the second test gradient is imported between the refocusing pulse and a temporal end of the read-out gradient, and wherein for both the first test gradient and the second test gradient, the gradient moment of the first part corresponds to the gradient moment of the second part.

12. The method of claim 4, wherein the first test gradient is imported before acquiring the first MR data, and the second test gradient is imported before acquiring the second MR data.

13. The method of claim 1, wherein each sequence of the first sequence and the second sequence is a gradient echo sequence.

14. The method of claim 13, wherein the RF excitation pulse is slice-selective, so the first test gradient and the second test gradient each act as a slice selection gradient.

15. The method of claim 1, wherein each sequence of the first sequence and the second sequence is a spin-echo sequence, and wherein the at least one RF pulse further comprises an RF refocusing pulse.

16. The method of claim 15, wherein each test gradient of the first test gradient and the second test gradient is imported during the RF excitation pulse.

17. The method of claim 15, wherein each test gradient of the first test gradient and the second test gradient is imported during the RF refocusing pulse.

18. The method of claim 14, wherein each test gradient of the first test gradient and the second test gradient is started such that the first test gradient and the second test gradient each attain a corresponding plateau before a beginning of the RF excitation pulse, the RF refocusing pulse, or the RF excitation pulse and the RF refocusing pulse.

19. The method of claim 14, wherein the RF excitation pulse, the RF refocusing pulse, or the RF excitation pulse and the RF refocusing pulse is slice-selective, so the first test gradient and the second test gradient act as a slice selection gradient.

\* \* \* \* \*